United States Patent [19]
Kennedy

[11] Patent Number: 5,132,635
[45] Date of Patent: Jul. 21, 1992

[54] SERIAL TESTING OF REMOVABLE CIRCUIT BOARDS ON A BACKPLANE BUS

[75] Inventor: Barry Kennedy, Santa Ana, Calif.

[73] Assignee: AST Research, Inc., Irvine, Calif.

[21] Appl. No.: 665,366

[22] Filed: Mar. 5, 1991

[51] Int. Cl.$^5$ .................... G01R 15/12; G06F 11/04
[52] U.S. Cl. .................... 324/158 R; 324/73.1; 371/15.1; 371/22.3; 371/27
[58] Field of Search ............ 324/158 F, 158 P, 158 R, 324/73.1; 371/15.1, 22.3, 22.5, 22.6, 26, 25.1, 27, 16.1; 340/653, 635; 361/403

[56] References Cited

U.S. PATENT DOCUMENTS

| | | | |
|---|---|---|---|
| 3,854,125 | 12/1974 | Ehlinget al. | 371/15.1 |
| 4,176,780 | 12/1979 | Sacher et al. | 371/26 |
| 4,736,374 | 4/1988 | Kump et al. | 371/15.1 |
| 4,963,824 | 10/1990 | Hsieh et al. | 324/158 R |
| 5,004,978 | 4/1991 | Morris, Jr. et al. | 371/27 |

OTHER PUBLICATIONS

Evanczuk, "IEEE 1149.1, A Designer's Reference", *High Performance Systems*, pp. 52-60, Aug. 1989.
McClean, Banerji & Whetsel, "Bringing 1149.1 Into the Real World", *High Performance Systems* pp. 61-70, Aug. 1989.
Hansen & Rosenblatt, "Handling the Transition to Boundary-Scan for Boards", *High Performance Systems*, pp. 74-81, Aug. 1989.

*Primary Examiner*—Vinh Nguyen
*Attorney, Agent, or Firm*—Knobbe, Martens, Olsen & Bear

[57] ABSTRACT

A system for controlling daisy-chain testing of removable printed circuit boards installed along a backplane bus facilitates the use of serial testing methods for circuit boards which are designed according to boundary-scan testing standards. The system automatically controls propagation of serial test data from a serial data pattern generator to a removable circuit board and then from circuit board to circuit board as installed consecutively along the backplane bus, and from the last circuit board installed on the bus to a pattern comparator which determines whether the pattern matches an expected pattern to isolate components on the circuit boards which are not functioning properly.

6 Claims, 3 Drawing Sheets

SERIAL TESTING OF REMOVABLE CIRCUIT BOARDS ON A BACKPLANE BUS

BACKGROUND OF THE INVENTION

1. Field of the Invention

The present invention relates to improvements in serial boundary-scan testing of removable circuit boards located on a backplane bus. Specifically, the invention involves a method and apparatus for allowing each removable circuit board to be daisy chained together and connected to a common serial data return line to facilitate boundary-scan testing of circuit boards selectively installed on the bus.

2. Description of Related Art

The increasing complexity of circuit designs and new integrated circuit packaging techniques leads to an ever increasing problem of testing integrated circuits and printed circuit boards (pc-boards). Software testing of digital hardware is constantly improving, but the complexity of the circuitry makes testing much more difficult unless the components are designed with testability in mind.

One method for testing circuitry which has received notable attention is the IEEE 1149.1 boundary-scan standard originated by the international Joint Test Action Group (JTAG). One implementation of this standard involves designing components for serial boundary-scan testing by providing shift-register elements daisy chained to form a path around the periphery of an integrated circuit component. The idea behind the serial testing is to shift serial data into and through a number of circuit components. The serial data follows a known path and exits the circuits altered by the circuit functions. A master testing circuit compares the return data to an expected result dependent upon the effect the circuit should have on the data shifted into the circuit. In other words, the circuit being tested, if it is functioning properly, produces known changes in the data stream before the data exits the circuit. If the data stream returned to the master testing circuit is not as expected, then a malfunction in the circuit is detected by the testing circuit. Usually, a careful analysis (under software control) of the deviations in the data stream isolates any malfunctions within a circuit.

Boundary-scan testing of components, as briefly explained above, can also be expanded to testing of an entire pc-board. Preferably, all of the integrated circuits on the pc-board to be tested are designed according to the JTAG standard. Testing of the pc-board is carried out in a manner similar to testing of the individual components except that the serial data propagates from integrated circuit to integrated circuit serially through the pc-board and is returned to the master testing circuit from the very last JTAG component on the pc-board.

This testing method functions smoothly as long as no testable integrated circuits in the daisy-chain are removed from the pc-board tested. For instance, this testing scheme works well for testing a microprocessor motherboard because the functions remain unchanged, and the circuitry is not usually removed.

However, the daisy-chain scheme is complicated if the testing method is expanded to test several removable pc-boards installed in a backplane bus of a computer system unless each slot on the bus has a separate serial data input line and a separate data return line for individual testing of each pc-board. If the pc-boards in the slots are daisy chained for serial testing with only one serial data input line to the first board and one common data return line for all the potential circuit boards along the bus, then a number of problems arise.

The main problem involves the common return line. If more than one removable circuit board is installed on the bus, then the data exiting each board during testing operations causes data collisions on the return line. If only one return line is provided from the last slot on the bus, then if any slot is empty, the daisy-chain path for serial test data is broken and the data exiting the circuit boards never reaches the return line.

Therefore, it is desirable to provide a system for daisy-chain serial testing of removable circuit boards selectively installed along a backplane bus.

SUMMARY OF THE INVENTION

The present invention involves a method and apparatus for using daisy-chain boundary-scan testing of removable printed circuit boards installed on a backplane data bus. The circuit boards installed on the bus are daisy chained together, with the serial test data output from each board installed on the bus connected to the serial test data input of the subsequent board on the bus.

The present invention provides a system to automatically control propagation of serial test data from a serial data pattern generator to a removable circuit board and then from circuit board to circuit board as installed consecutively along the backplane bus, and from the last circuit board installed on the bus to a pattern comparator which determines whether the pattern matches an expected pattern to isolate components on the circuit boards which are not functioning properly.

The data is automatically returned only from the last circuit board installed on the bus because each circuit board has a serial data return line connected to a common data line which returns to a master pattern comparator. This connection to the common return line is automatically disabled if a circuit board is installed in the subsequent slot on the bus, such that only the last card along the bus provides its output data to the common return line. Disabling the connection to the common return line is completed without microprocessor control or manual intervention.

One aspect of the present invention involves a boundary-scan testing system for use with removable printed circuit boards (pc-boards) installed in consecutive connection slots of a backplane bus, wherein the backplane bus has a mode line and a test clock line, and wherein the pc-boards contain components which are designed in accordance with conventional serial testing standards, such as the IEEE 1149.1 standard. The system comprises a test controller, at least one printed circuit board installed on the backplane bus, wherein the printed circuit board contains boundary-scan testable components, serial data interconnections between each slot on the backplane bus, a common serial test data return line connected to the slot occupied detector circuit and connected to the test controller, and a slot occupied detector circuit for said printed circuit board which accepts serial test data, and, in response to a slot occupied signal determined by the presence of a pc-board installed in the subsequent slot along said backplane bus, selectively enables the serial test data onto said serial data interconnection to the subsequent slot if the subsequent slot is occupied, or the common return line if the subsequent slot is not occupied.

The slot occupied detector circuit for the printed circuit board comprises enable gate logic responsive to the slot occupied signal.

DETAILED DESCRIPTION OF THE PREFERRED EMBODIMENT

Figure 1:
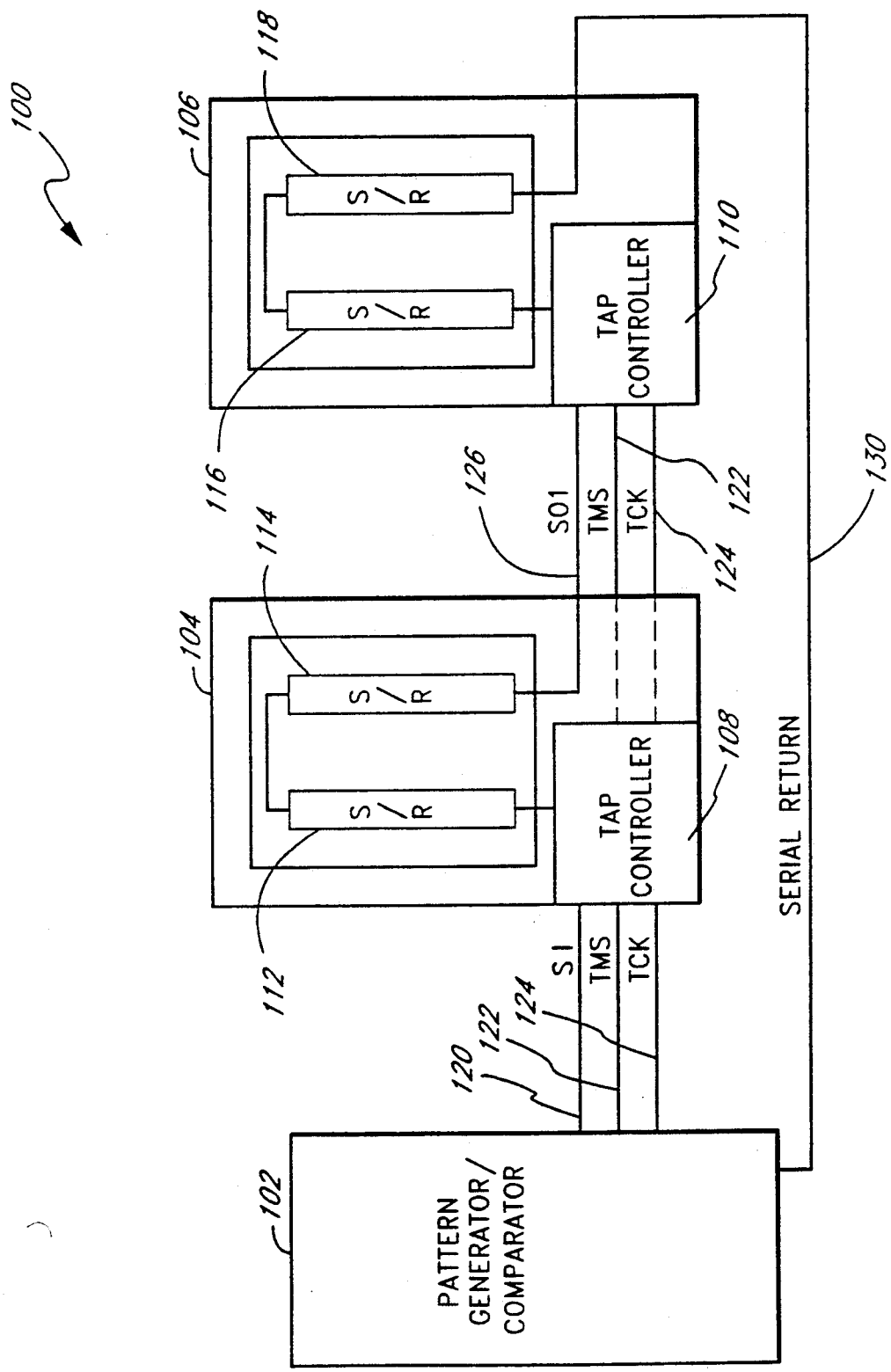
FIG. 1 depicts a conventional configuration for boundary-scan testing of circuit components.

FIG. 1 illustrates an exemplary JTAG IEEE 1149.1 daisy-chain boundary-scan serial testing system 100 for testing the components of integrated circuits. (For further information on IEEE 1149.1, see Evanczuk, *IEEE 1149.1, A Designer's Reference,* High Performance Systems, 52-60, (August 1989); Hansen and Rosenblatt, *Handling the Transition to Boundary Scan For Boards,* High Performance Systems, pp. 74-81).

The exemplary JTAG system 100 comprises a master pattern generator/comparator 102, circuit components 104 and 106 designed to comply with the IEEE 1149:1 standard. Accordingly, component 104 has a respective Test Access Port (TAP) controller 108, a respective input shift register 112 and a respective output shift register 114; and component 106 has a respective TAP controller 110, a respective input shift register 116 and a respective output shift register 118. The shift registers 112, 114, and the shift registers 116, 118 are connected in a daisy-chain. The pattern generator/comparator 102 provides serial test data on a serial-in (SI) signal line 120 to the first TAP controller 108. A serial-out-1 (SO1) line 126 from the component 104 carries the test data to the TAP controller 110 for component 106. A serial return line 130 connected from the component 106 to the pattern generator/comparator 102 returns test data from the last shift register 118 in the daisy-chain for analysis.

The TAP controllers 108, 110 accept signals on a Test Mode Select (TMS) signal line 122. Based on changes in the state of the TMS signal line 122, as observed on the rising edge of TCK, the TAP controllers 108, 110 place the test logic in various states as defined by the IEEE 1149.1 specification, as well understood in the art. The TAP controllers 108, 110 also respond to clock pulses on a Test Clock Input (TCK) signal line 124 for timing control of the boundary-scan TAP controllers 108, 110 and the shift registers 112, 114, 116 and 118. This allows for timing control of the boundary-scan operations independent from other circuit timing. These aspects of JTAG testing are well understood in the art.

During test operations, the TMS line 122 is used to select either the command or data mode for the TAP controllers 108, 110. If command mode is selected, serial test data from the pattern generator/comparator 102 which enters TAP controller on the SI signal line 108 contains commands which indicate what testing operation follows as is well understood in the art. If the mode selected by the signal on the TMS signal line 122 is data mode, then the serial data on the SI signal line 120 from the pattern comparator 102 is directed by the TAP controllers 108, 110 to the appropriate shift registers 112, 114, 116 and/or 118 depending on the operation selected with a previous command.

For instance, if in command mode, the command received by the TAP controllers 108, 110 is to set up input data, then when the signal on the TMS line 122 changes to select data mode, the data provided on the SI signal line 120 by the pattern generator/comparator 102 is directed by the TAP controllers 108, 110 into input shift registers 112 and 116 via signal lines 125 and 127 respectively, for each component 104, 106. The mode may then change to command mode and a command sent to the TAP controllers that the following operation is to capture output data from the circuit components 104, 106 in the output shift registers 114 and 118 for components 104 and 106 respectively. The data then shifted from the output shift registers contains data modified by the functions of the components 104, 106 as well understood in the art. The resulting data from the output shift registers propagates through the daisy chain of shift registers 114, 116, and 118, depending on the mode selected, to the pattern generator/comparator 102 on the serial return line 130.

The pattern generator/comparator 102 compares the returned test data to an expected result which depends upon the functions of the circuits tested and the mode selected. If the returned data does not match the expected pattern, then a malfunction in the circuits 104, 106 is detected. Generally, the return data is analyzed under software control to isolate the malfunction(s) in the circuits 104, 106.

The testing system 100 functions properly if the daisy-chain remains unbroken. However, if one of the circuit components 104, 106 is removed, the data cannot propagate through the daisy-chain to reach the return line 130. Similarly, if pc-boards installed in slots on a backplane bus are consecutively daisy-chained for serial boundary-scan testing in a manner similar to that shown in FIG. 1, provision needs to be made for determining from which slot to return the data. If the serial data returns from the last slot on the bus to a pattern comparator, all slots need to contain a circuit board or a jumper in order for the data to reach the return line. If at least one of the slots does not contain a circuit board or a jumper, the serial path is broken and the data does not return to the pattern comparator. Each circuit board could have a separate serial input and serial output for individualized testing. However, this would significantly increase the complexity of the testing hardware and software. Finally, if each slot had a serial-out line connected to one common serial return line, so that having less than all slots containing circuit boards would not prevent the serial data from returning to the pattern comparator, signals would collide on the common serial return line if more than one circuit board is installed on the bus.

Figure 2:
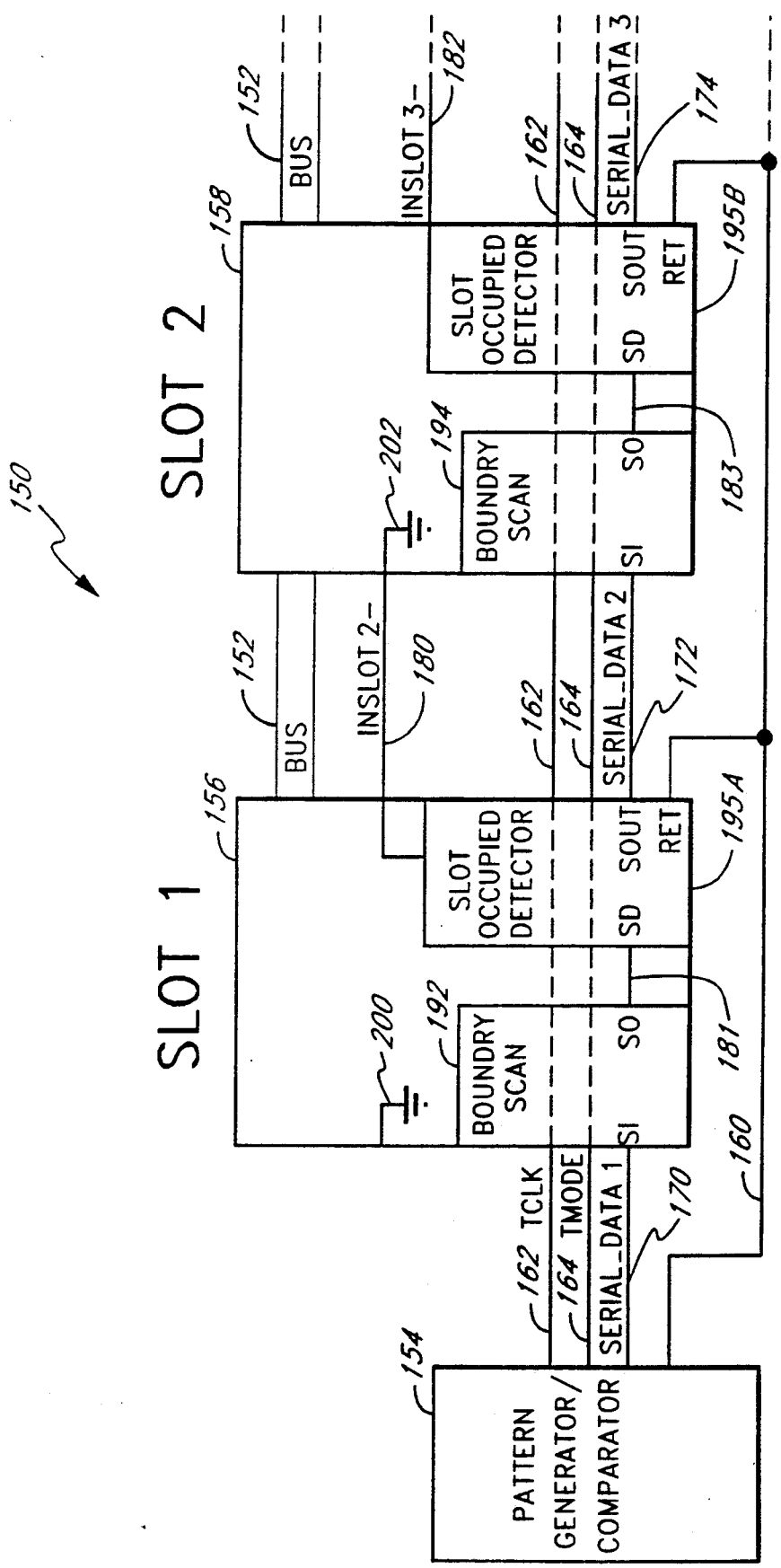
FIG. 2 depicts a block diagram of the present invention for testing removable circuit boards installed on a backplane bus.

The present invention overcomes the difficulty of selectively returning the serial test data and allows daisy-chain serial testing of removable pc-boards installed in a backplane bus. The system 150 of the present invention, shown in FIG. 2, comprises a boundary scan pattern generator/comparator 154, a backplane interconnecting bus 152 with pc-boards 156 and 158 in slot 1 and slot 2 of the bus 152, respectively. The system 150 need not comprise the two pc-boards 156 and 158, but may have fewer or more boards installed consecutively along the bus 152. This versatility will become apparent with the following description. However, for discussion purposes, the invention is described below with reference to pc-boards 156 and 158 installed in slot 1 and slot 2 on the backplane bus 152.

The backplane bus 152 is any backplane bus, and interconnections are provided for implementing serial daisy-chain testability. For instance, the system 150 comprises a common serial-return signal line 160, a test clock (TCLK) signal line 162 and a test mode (TMODE) signal line 164 from the generator pattern comparator 154. Additionally, slot 1 is connected to the pattern generator 154 via a SERIAL$_{13}$ DATA1 signal line 170 and each slot is interconnected with the subsequent slot with a SERIAL_DATAn signal line (e.g. a SERIAL_DATA2 line 172, and SERIAL_DATA3 line 174). Finally, each slot is interconnected with the subsequent slot with an INSLOTn-signal line (e.g. an INSLOT2- signal line 180, and an INSLOT3- signal line 182).

The pattern generator/comparator 154 is the boundary-scan "test master" which comprises higher level test architecture under software control to manage the boundary-scan test process.

The pc-boards 156, 158 are designed with boundary-scan circuitry 192 and 194 for testability of the components on the board. These circuits 192, 194 are designed in accordance with the IEEE 1149.1 boundary-scan standard and include TAP controllers and shift registers for testing as described for components 104 and 106 (FIG. 1). The boundary-scan circuits 192 and 194 respond to a mode select signal on the TMODE signal line 164 and a clock pulse signal on the TCLK signal line 164. The boundary-scan circuit 192 accepts serial test data on the SERIAL$_{13}$ DATA1 signal line 170 from the pattern generator/comparator 154. The boundary scan circuitry 194 accepts serial data on the SERIAL_DATA2 signal line 172.

Each pc-board 156, 158 installed on the backplane bus 152 further comprises slot occupied detector circuits 195A and 195B respectively. The slot occupied detector circuit 195A responds to a signal on the INSLOT2- signal line 180 to selectively enable serial test data which has shifted through the boundary-scan circuit 192 to signal line 181 onto the SERIAL_DATA2 signal line 172 or onto the common serial-return line 160. The slot occupied detector circuit 195B functions in the same manner as slot detect logic 195A and responds to a signal on the INSLOT3- signal line 182 to selectively enable serial test data on the signal line 183 onto the SERIAL_DATA3 signal line 174 or onto the common serial return signal line 160. The pc-boards 156 and 158 for use in the present invention further comprise ground connections 200 and 202, respectively.

Figure 3:
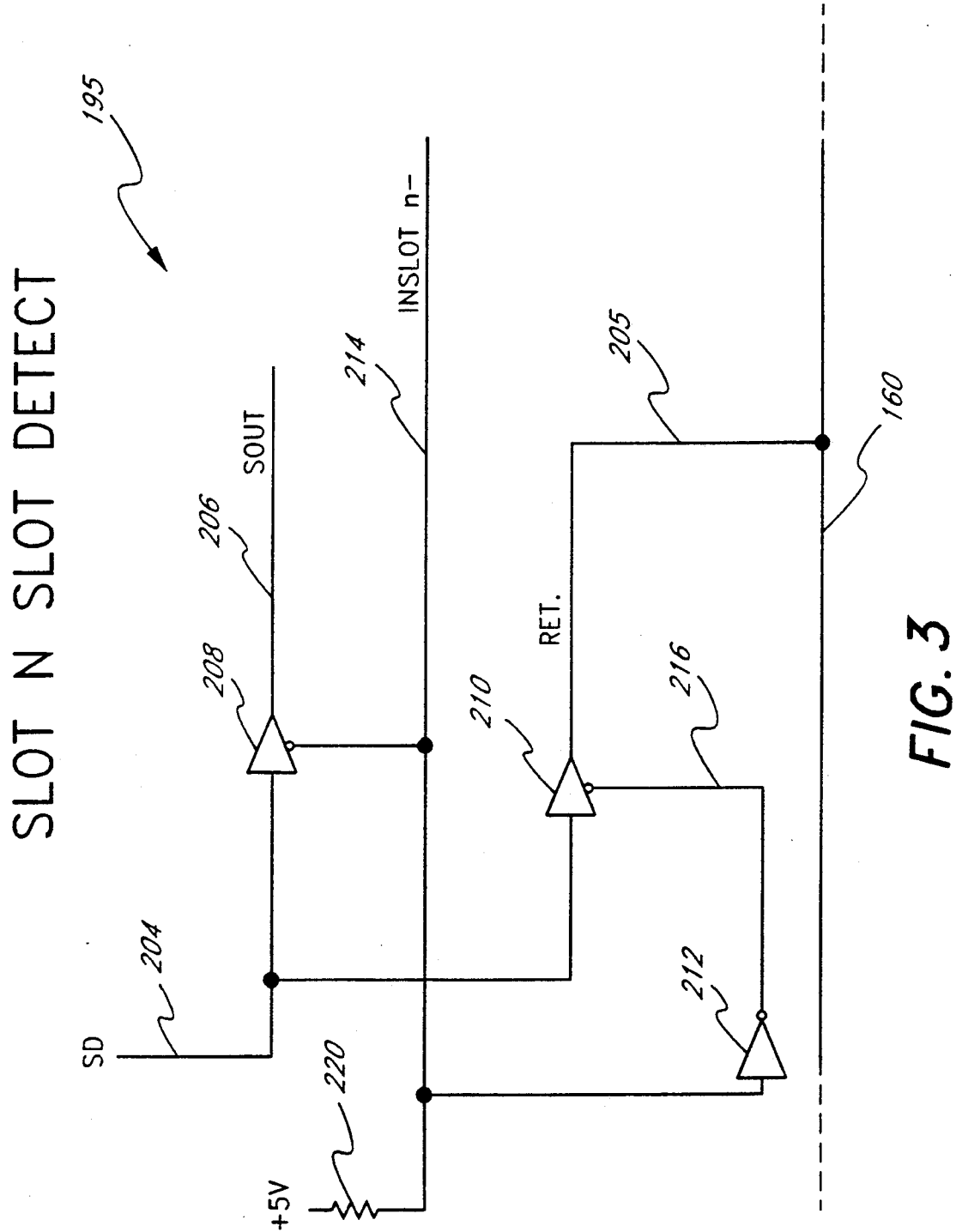
FIG. 3 depicts a schematic diagram of the return line connection disable logic of the present invention.

FIG. 3 depicts the schematic diagram of the logic 195 corresponding to slot occupied detector circuits 195A and 195B and slot occupied detector circuits on any additional pc-boards on the bus 152. In the present embodiment, the logic 195 comprises tri-state gates 208 and 210 and an inverter 212. The logic 195 responds to a slot occupied signal on an INSLOTn- signal line 214 to selectively enable signals from a serial data (SD) line 204 onto either a return (RET) signal line 205 connected to the common serial return signal line 160, or onto a serial out (SOUT) signal line 206 connected to the SERIAL_DATAn signal line to the next slot (e.g., the SERIAL_DATA2 signal line 172 between slot 1 and slot 2, or the SERIAL_DATA3 signal line 174 between slot 2 and slot 3).

The function of the invention is most readily explained in reference to two pc-boards installed in two consecutive slots on the bus 152. For discussion purposes, the function of the invention is discussed in reference to the pc-board 156 in slot 1 and the pc-board 158 in slot 2.

In the present embodiment, the pattern generator/comparator 154 generates the serial data stream under software control for boundary-scan testing according to the IEEE 1149.1 standard. The pc-board 156 in slot 1, designed for serial boundary-scan testing, is the first pc-board with circuitry to be tested.

The serial data stream generated by the pattern generator 154 enters the boundary-scan circuit 192 and is shifted through the boundary-scan circuitry 192 of the pc-board 156 in slot 1. Once the test data from the pattern generator 154 propagates through the pc-board 156 in slot 1, the data is either enabled from the data line 181 connected to the SD signal line 204 (FIG. 3) of the slot occupied detector circuit 195A onto the SOUT signal line 206 connected to the SERIAL_DATA2 signal line 172 or onto the RET signal line 204 connected to the common serial return data line 160.

The level of the signal on the INSLOT2- signal line 180 which connects to the INSLOTn- signal line 214 of the slot occupied detector circuit 195A determines which path the serial data follows. If the signal on the INSLOT2-signal line 180 is low, then this enables tri-state gate 208 to allow the data on the SD signal line 204 to propagate onto the SOUT signal line 206 connected to the SERIAL_DATA2 signal line 172. A high signal on the INSLOT2- signal line 180 is inverted by inverter 212 to a low signal on signal line 216 to enable tri-state gate 210 to allow data on the SD signal line 204 to propagate to the RET line 204 connected to the common serial-return line 160.

The level of the signal on the INSLOT2- signal line 180 depends upon whether a pc-board is installed in slot 2. The INSLOT2- signal line 180 is connected through a pull-up resistor 220 to +5 V. Thus, unless otherwise grounded, the signal on the INSLOT2- signal line 180 is high. When the pc-board 158 is installed in slot 2, the ground connector 202 on that board 158 connects the INSLOT2- signal line 180 to ground. This pulls the signal on the INSLOT2- signal line 180 low.

Accordingly, if no pc-board is installed in slot 2 of the bus 152, then the signal on the INSLOT2- siqnal line 180 is high and the serial test data on the signal line 181 propagates through tri-state gate 210 of the slot occupied detector circuit 195A onto the RET signal line 204 connected to the common serial return line 160. If pc-board 158 is installed in slot 2, then the signal on the INSLOT2- signal line 180 is low, and the serial test data propagates from the data line 181 through tri-state gate 208 of the slot occupied detector circuit 195A to the SOUT signal line 206 connected to the SERIAL-DATA2 line 172 which provides serial data to the boundary-scan circuitry 194.

Testing of pc-boards installed in subsequent slots on the bus proceeds in the same manner. For instance, if slot 2 contains pc-board 158 and slot 3 is empty, then the serial data propagates into the pc-board 158 in slot 2, as previously explained. The serial test data exiting pc-board 158 then propagates onto the common serial return line 160 in the same manner as explained for slot 1 when no pc-board was installed in slot 2.

Accordingly, as long as pc-boards with the slot detector logic 195 and ground connectors (e.g., connectors 200 and 202) are installed consecutively in the bus 150, the serial test data will propagate through the daisy-chained pc-boards to perform a boundary-scan serial test, and the only pc-board that provides data to the common serial-return line 160 is the last pc-board installed on the bus, which need not be installed in the last slot on the bus.

Although the preferred embodiment of the present invention has been described and illustrated above, those skilled in the art will appreciate that various changes and modifications can be made to the present invention without departing from its spirit. Accordingly, the scope of the present invention is limited only by the scope of the following appended claims.

What is claimed is:

1. A boundary-scan testing system for use with removable printed circuit boards installed consecutively on a backplane bus having first and second connection slots, said connection slots having input connections and output connections, said backplane bus also having a mode line and a test clock line, wherein the printed circuit boards contain components which are designed in accordance with conventional serial testing standards, the system comprising:
   a system test controller connected to said mode line and said test clock line; and which generates serial test data
   a printed circuit board installed in said first slot on said backplane bus, wherein said printed circuit board contains boundary-scan testable components;
   serial data interconnections between said test controller and said first slot and between said first slot and said second slot on said backplane bus;
   a common serial test data return line connected to one of said output connections of said first slot and to one of said output connections of said second slot, said common serial test data return line also connected to said system test controller; and
   a slot occupied detector for said printed circuit board, wherein said slot occupied detector accepts serial test data, wherein in response to a slot occupied signal determined by the presence of a printed circuit board installed in the second slot along said backplane bus, the slot occupied detector selectively enables said serial test data onto said serial data interconnection to said second slot if a printed circuit board is installed in said second slot, or enables said serial test data onto said common serial test data return line if a printed circuit board is not installed in said second slot.

2. The boundary-scan testing system of claim 1, wherein said slot occupied detector for said printed circuit board comprises enable gate logic responsive to said slot occupied signal.

3. A boundary-scan testing system for use with removable printed circuit boards installed consecutively on a backplane bus having first and second connection slots, said first and second connection slots having respective input connections and output connections, said backplane bus also having a mode line and a test clock line, wherein the printed circuit boards contains components which are designed in accordance with conventional serial testing standards, the system comprising:
   a system test controller connected to said mode line and said test clock line and which generates serial test data on a first serial test data interconnection connected between said system test controller and an input connection of said first slot;
   a printed circuit board installed in said first slot on said backplane bus, wherein said printed circuit board contains boundary-scan testable components responsive to the serial test data o said first serial test data interconnection, and further responsive to signals on the mode signal line and the test clock signal line;
   a second serial test data interconnection between said first slot and said second slot on said backplane bus;
   a common serial test data return line connected to one of said output connections of said first slot and to one of said output connections of said second slot, said common serial test data return line also connected to said system test controller; and
   a slot occupied detector for said first slot, said slot occupied detector having a first output connected to the second serial test data interconnection and a second output connected to the common serial test data return line, wherein said slot occupied detector accepts serial test data from said boundary scan testable components, and, in response to a slot occupied signal determined by the presence of a printed circuit board installed in the second slot along said backplane bus, selectively enables said serial test data onto either said first output or said second output.

4. The boundary-scan testing system of claim 3, wherein said slot occupied detector for said printed circuit board comprises enable gate logic responsive to said slot occupied signal.

5. A boundary-scan testing system for use with removable printed circuit boards installed consecutively on a backplane bus, said backplane bus having first and second connection slots, said first and second connection slots having respective input connections and output connections, said backplane bus also having a mode line and a test clock line, and wherein the printed circuit boards contain components which are designed in accordance with conventional serial testing standards, the system comprising:
   a system test controller connected to said mode line and said test clock line and which generates serial test data on a first serial test data interconnection between said system test controller and one of said input connections of said first slot;
   a second serial test data interconnection between a first of said output connections of said first slot and a first of said input connections of said second slot on said backplane bus;
   a common serial test data return line connected to a second of said output connections of said first slot and connected to one of said output connections of said second slot, said common serial test data return line also connected to said system test controller; and
   a slot occupied detector for said first slot, said slot occupied detector having a first output connected to the second serial data interconnection and a second output connected to the common serial test data return line, wherein said slot occupied detector accepts serial test data and, in response to a slot occupied signal determined by the presence of a printed circuit board installed in the second slot along said backplane bus, selectively enables said serial test data onto either said first or said second output.

6. The boundary-scan testing system of claim 5, wherein said slot occupied detector selectively enables said serial test data onto said first output of said slot occupied detector if a printed circuit board is installed in the second slot along said backplane bus, and selectively enables said serial test data onto said second output of said slot occupied detector if a printed circuit board is not installed in the second slot along said backplane bus.

* * * * *

UNITED STATES PATENT AND TRADEMARK OFFICE
CERTIFICATE OF CORRECTION

PATENT NO. : 5,132,635

DATED : July 21, 1992

INVENTOR(S) : Barry Kennedy

It is certified that error appears in the above-indentified patent and that said Letters Patent is hereby corrected as shown below:

In Claim 3 at line 18 (column 7, line 67), between "data" and "said", replace "o" with --on--.

Signed and Sealed this

Seventeenth Day of December, 1996

Attest:

BRUCE LEHMAN

*Attesting Officer*   *Commissioner of Patents and Trademarks*